United States Patent [19]

Hawkins et al.

[11] Patent Number: 4,822,755
[45] Date of Patent: Apr. 18, 1989

[54] METHOD OF FABRICATING LARGE AREA SEMICONDUCTOR ARRAYS

[75] Inventors: William G. Hawkins, Webster; Donald J. Drake, Rochester; Michael R. Campanelli, Webster, all of N.Y.

[73] Assignee: Xerox Corporation, Stamford, Conn.

[21] Appl. No.: 185,600

[22] Filed: Apr. 25, 1988

[51] Int. Cl.[4] ............... H01L 21/00; H01L 21/02; H01L 21/72; H01L 21/98
[52] U.S. Cl. ......................... 437/227; 437/51; 437/226; 437/228; 156/643; 156/647; 156/646
[58] Field of Search ............. 437/226, 227, 228, 51; 156/643, 647

[56] References Cited

U.S. PATENT DOCUMENTS

| | | | |
|---|---|---|---|
| 3,689,389 | 9/1972 | Waggener | 156/646 |
| 4,295,924 | 10/1981 | Garnache et al. | 156/643 |
| 4,358,340 | 11/1982 | Fu | 156/643 |
| 4,409,319 | 10/1983 | Colacino et al. | 156/643 |
| 4,523,369 | 6/1985 | Nagakubo | 437/228 |
| 4,526,631 | 7/1985 | Silvestri et al. | 437/228 |
| 4,542,397 | 9/1985 | Biegelsen et al. | 357/32 |
| 4,589,952 | 5/1986 | Behringer et al. | 156/628 |
| 4,604,161 | 8/1986 | Araghi | 156/645 |
| 4,612,554 | 9/1986 | Poleshuk | 346/140 R |
| 4,661,201 | 4/1987 | Petridis et al. | 156/643 |
| 4,670,092 | 6/1987 | Motamedi | 156/643 |

FOREIGN PATENT DOCUMENTS

| | | | |
|---|---|---|---|
| 0045879 | 4/1977 | Japan | 437/226 |
| 0025350 | 3/1978 | Japan | 437/226 |
| 0091138 | 7/1980 | Japan | 437/226 |
| 60-157236 | 8/1985 | Japan | |
| 0216338 | 9/1986 | Japan | 437/226 |

OTHER PUBLICATIONS

Jackson, T. N., An Electrochemical P-N Junction Etch-Stop for The Formation of Silicon Microstructures, 2/81, IEEE Electron Device Lett., vol. EDL-2, No. 2, pp. 44-45.

Primary Examiner—Brian E. Hearn
Assistant Examiner—Byron S. Everhart

[57] ABSTRACT

A method for separating chips formed on a silicon substrate is provided which uses a combination of reactive ion etching techniques combined with orientation etching to yield integrated chips having edges which can be more precisely butted together to form large area arrays.

13 Claims, 10 Drawing Sheets

METHOD OF FABRICATING LARGE AREA SEMICONDUCTOR ARRAYS

BACKGROUND AND INFORMATION DISCLOSURE STATEMENT

This invention relates to large scale semiconductor arrays and, more particularly, to aligning a plurality of integrated circuit semiconductor chips into a linear or two-dimensional array.

There is a growing need for an inexpensive and simple method for abutting or aligning semiconductor integrated circuit (IC) chips and interconnecting them to effectively product page width linear arrays or two-dimensional arrays extending up to a full page size. There is a demand for large area arrays for various applications such as displays, read or write image bars, and thermal ink jet printers. Conventionally, a plurality of IC chips are formed from a wafer die and are separated from each other by a dicing technique. The chips are then tested and the "good" chips are bonded together to form a larger array. The dicing technique creates fractures along the etched crystal plane leaving edges and sometimes damaging passivation layers on the circuit surface near the fracture. A further problem with prior art dicing techniques is that chips to be aligned are not the same height, and a slight lateral mis-alignment results since the aligned surface are at an angle to each other. Chip mis-alignment can result from wafer-to-wafer variations.

The present invention is directed towards forming large area arrays by butting together a plurality of integrated circuit chips using techniques avoiding the above-mentioned problems and not disclosed in the prior art. According to one aspect of the invention, the wafer fabrication technique is modified to include a combination of orientation dependent etching and reactive ion etching steps to enable chip separation to be accomplished without the resulting chip edges or surface damage. More particularly, the invention is directed towards a method for separating integrated circuit chips formed on a crystalline substrate comprising the steps of (a) forming a plurality of vertical trenches along predetermined intersecting lateral boundaries on the top surface of said substrate by a reactive ion etch process, (b) filling in said trenches with an etchable material, (c) forming a plurality of integrated circuits on the surface of said substrate with said lateral boundaries, (d) passivating both surfaces of said substrate, (e) and orientation etching a plurality of V-shaped grooves on the back of the wafer in general alignment with said vertical trenches, said etching being adapted to etch into, and form new trenches from said etchable material, whereby said integrated circuits are separated by the combined action of said top and bottom etching steps, said circuits being formed with planar butting surfaces created by the vertical trench formation.

The following publications are considered as material: U.S. Pat. No. 4,612,554 to Poleshuk, discloses an ink jet printhead apparatus comprising two identical parts and a method for producing the same. A plurality of V-shaped groves are anisotropically etched on each part of the apparatus between a linear array of heating elements. The grooves allow the structures to be mated in an automatically self-aligned manner.

U.S. Pat. No. 4,604,161 to Araghi teaches a method for fabricating an image sensor array. An active surface of an array chip is etched to form a V-shaped groove which marks an array end. A groove is then cut into the opposite inactive surface with a centerline parallel to, but offset form, the centerline of the V-shaped groove. Forcible fracturing of the chip along the {111} crystalline plane between the grooves produces a straight array end for butting against the end of a like array.

Japanese Pat. No. 60-157236 to Murata discloses a method of dicing a semiconductor substrate. A first full-cut or half-cut is made into one side of the semiconductor substrate with a first blade. Then, another cut is made into the other side of the semiconductor substrate, opposite the first cut, with a blade wider than the first blade.

U.S. Pat. No. 4,589,952 to Behringer et al discloses a method of making trenches having substantially vertical sidewalls in a silicon substrate, wherein a thick photoresist layer, a silicon nitride layer and a thin photoresist layer are sequentially formed on the surface of the substrate and reactive ion etched to form the trenches.

U.S. Pat. No. 4,542,397 to Biegelsen et al discloses the formation of large scale arrays from integrated chips on a wafer, which is characterized as having a parallelogrammatic like geometry.

IN THE DRAWINGS

DESCRIPTION OF THE INVENTION

Figure 1:
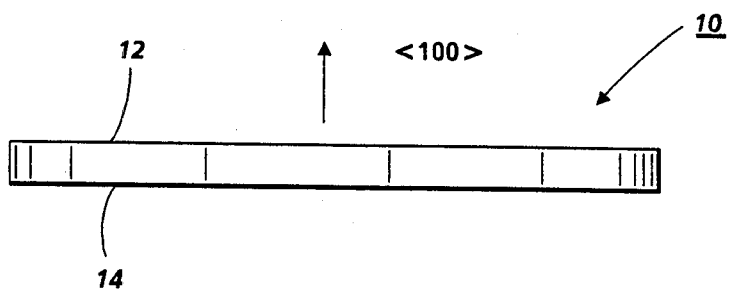
FIG. 1 is a side view of an <100> axial wafer of semiconductive crystalline material.
Figure 2:
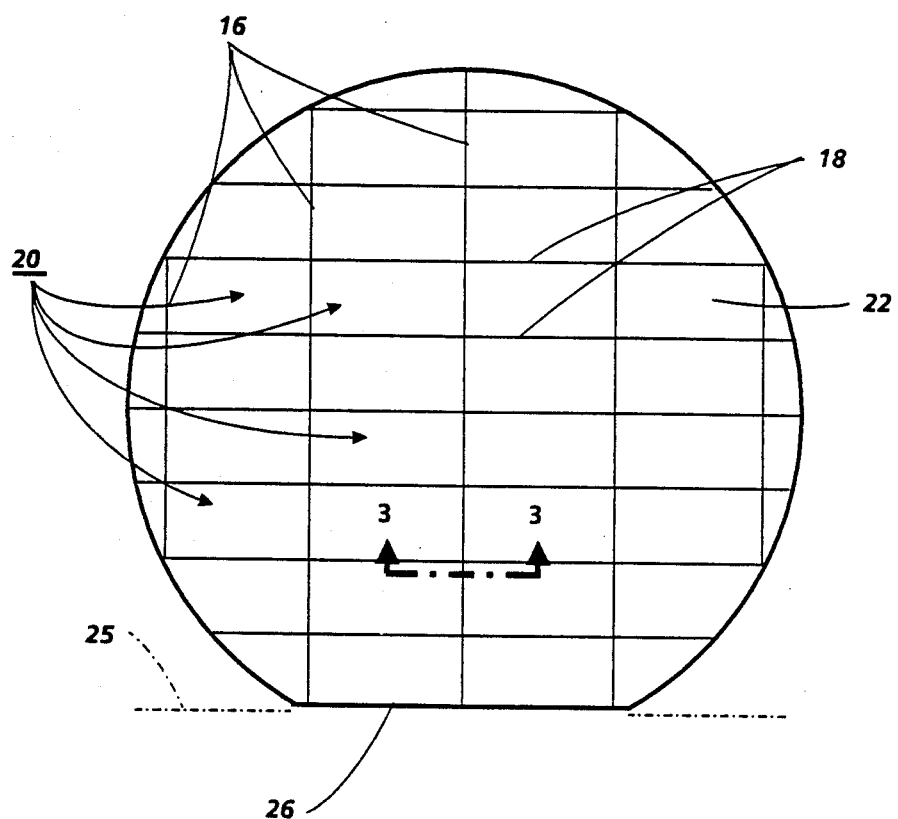
FIG. 2 is a top view of a silicon wafer prior to separation of the individual chips therefrom.

As shown in FIGS. 1 and 2, a wafer 10 of semiconductor material has two opposed surfaces 12 and 14. For purposes of description of the invention, wafer 10 is silicon with a <100> axial orientation. However, the technique disclosed below is applicable in principle for most crystalline materials and is not restricted to silicon.

In FIG. 2, the surface of wafer 10 has been marked off with imaginary lines 16 and 18 creating a grid pattern within which IC chips 20 are formed. Chips 20 may be identical to, or different from each other depending upon the particular application. For purposes of description, chips 20 comprise a plurality of identical circuits which can be individually assembled to form a full page thermal ink jet printing device. Each chip 20 contains an array of electronic sensing or printing elements and necessary associated circuitry to enable interconnection off the chip. For specific inkjet applications, each chip 20 is formed with transistor drive logic and resistive heater elements integrated therein. A copending application, Ser. No. 164,669, filed on Mar. 7, 1988, assigned to the same assignee as the present invention, is hereby incorporated by reference.

This application describes the processing steps used to fabricate a monolithic integrated circuit chip having this function. Following the appropriate processing steps, the chips 20 are separated and then bonded together to form, for example, a resistive plate which together has a channel plate, comprise a full page thermal ink jet printhead.

Figure 3:
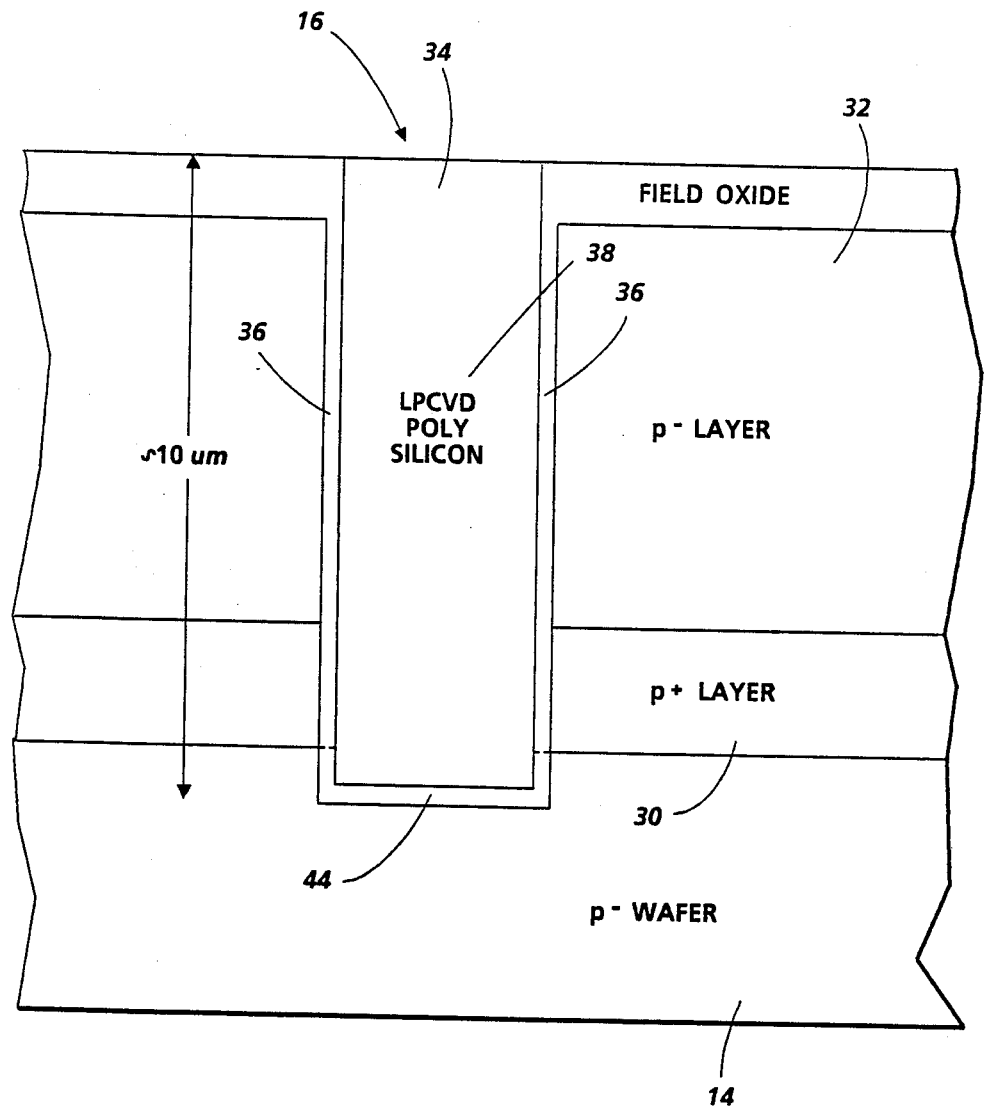
FIG. 3 is an enlarged side view, in cross section of a portion of the wafer shown in FIG. 2 showing details of a first processing and etching step.

Prior to processing of the wafer 10 to form the desired circuits, processing steps are performed along the separation lines 16 and 18 so as to enable the final etching steps which will separate the chips. FIG. 3 shows a sectional view of the circled area from FIG. 2, the circled area extending on both sides of one of the separation lines 16. It is understood that the following description pertains to chip separation processing along all of the lines 16, 18. As shown in FIG. 3, a p+ layer 30 is formed in wafer 10, approximately 10 microns below the surface. Layer 30, approximately 2-3 microns thick, will be used as an orientation dependent etch stop when the wafer is etched from the backside as will be seen. Layer 30 is formed beneath a lightly doped p— layer 32 approximately 10 microns thick. The first process step is to etch vertical trenches 34 in the wafer surface by a reactive ion etching process. As is know in the art, this technique is distinguished by a high degree of directional (anisotropic) etching so that almost vertical sidewalls can be formed. Trench 34 is typically 2-3 microns wide and about 10 microns deep extending through layers 32 and 30. Trench 34 is oxidized and then filled with a low pressure CVD polysilicon forming field oxide layer 36 and polysilicon plug 38.

Figure 4:
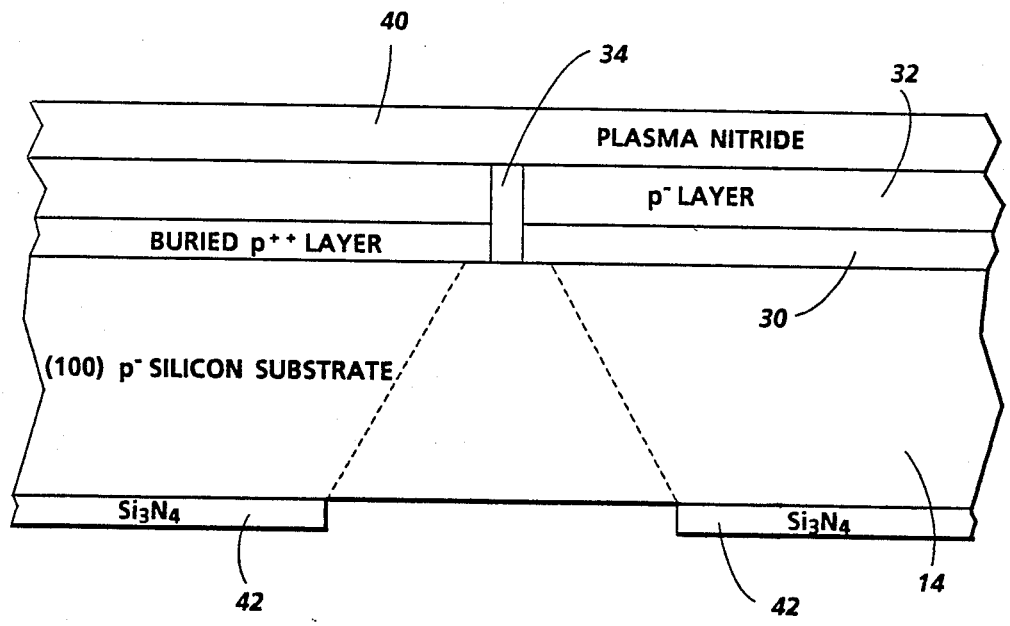
FIG. 4 shows the wafer cross section of FIG. 3 following a second processing step.
Figure 5:
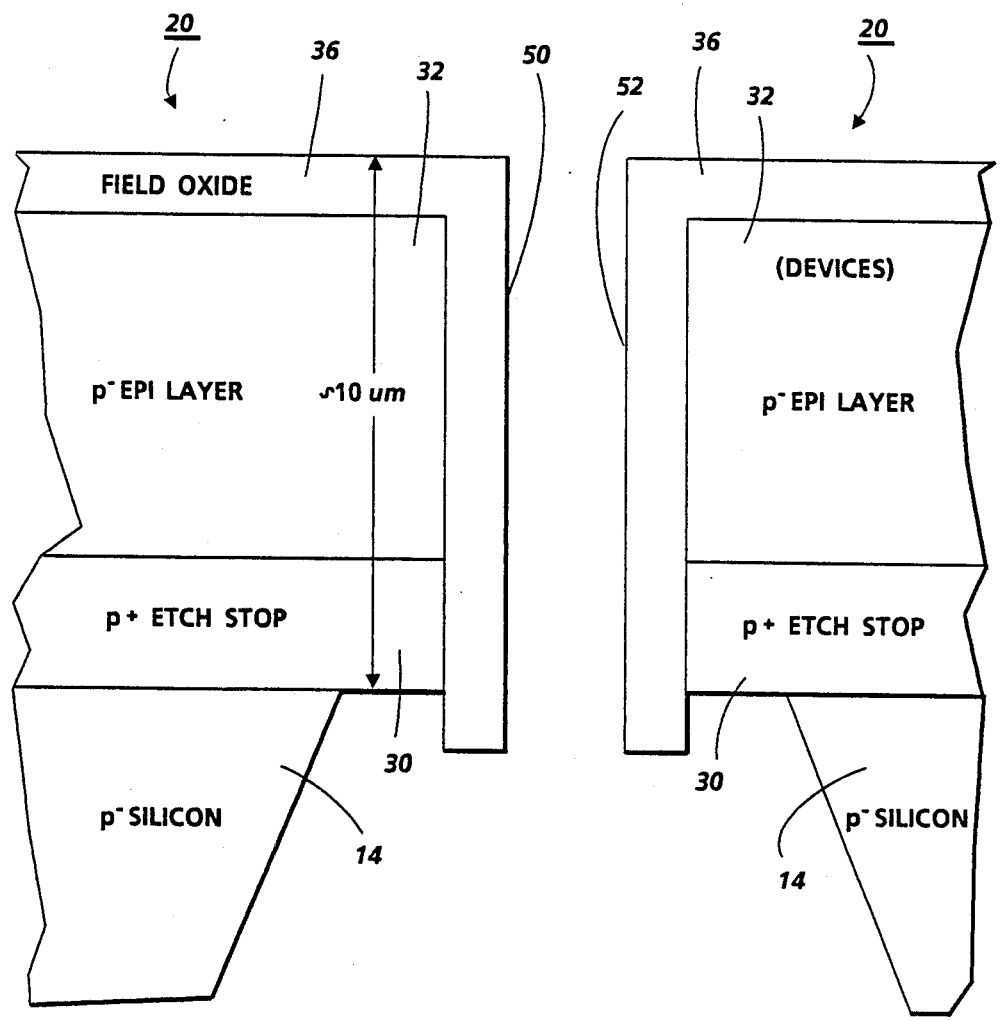
FIG. 5 shows the wafer cross section of FIG. 3 following the chip separation.

A normal wafer fabrication sequence using, for example, the technology disclosed in the aforementioned application, is now implemented to form logic and sensor or printing elements of the completed circuit. Once the logic, and resistor fabrication sequence is complete, the chip is passivated with PSG followed by coating of top and bottom surfaces with a plasma-enchanced $Si_3N_4$ coating 40, 42 respectively (FIG. 4). The PSG is patterned to expose bonding pads before deposition of the plasma nitride. The plasma nitride on the back of the wafer is patterned and aligned using an IR aligner. The plasma nitride coating protects the completed circuitry from attack by orientation dependent etch, (dotted lines) which is shown as terminating at p+ layer 30. The front side of the wafer can alternatively be protected by being clamped against silicone or ethyelene-propylene elastomeric material with teflon or stainless steel. The etching is made through an ODE etch mask whose alignment with trench 34 is not critical so long as some latitude is designed into the mask. The ODE etch is interrupted so that a short wet oxide etch (buffered oxide etchant) can be used to etch through the oxide layer 44 at the bottom of the trench (FIG. 3). The wafer is then replaced in the ODE solution to etch away polysilicon block 38. FIG. 5 shows the wafer at this point with two adjoining chips 20 being separated as a result of retrench 34 being met by the ODE etch. At this point the $Si_3N_4$ layers 40, 42 are stripped away with a plasma etch and metallization applied to the back of the wafer for ohmic contact. As shown in FIG. 5, this separation results in planar butting surface 50, 52 for each of the chips 20. The chips are free from sharp edges and, assuming both chips are tested and found to be operational, they can be butted together. Since the butting surfaces are planar, some lateral (vertical) mis-alignment can be accepted to ensure proper chip-to-chip alignment. This processing and etch separation is performed along all of the lines 16, 18 (FIG. 2) separating all the chips 20. The chips can then be tested and are aligned and bonded to other chips to form the desired large area array.

Figure 6:
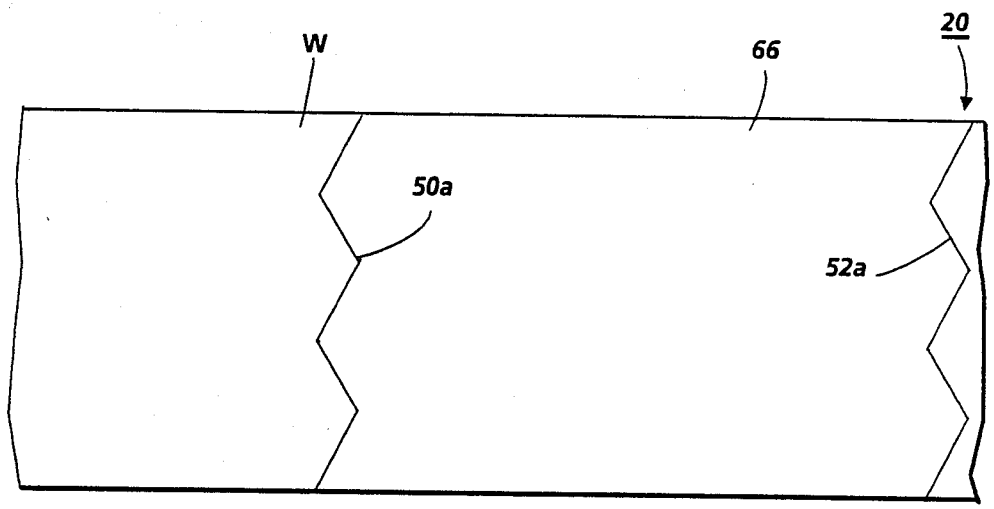
FIGS. 6 and 7 shows buttable chip edges of different geometry than that of the FIGS. 5 embodiment.
Figure 7:
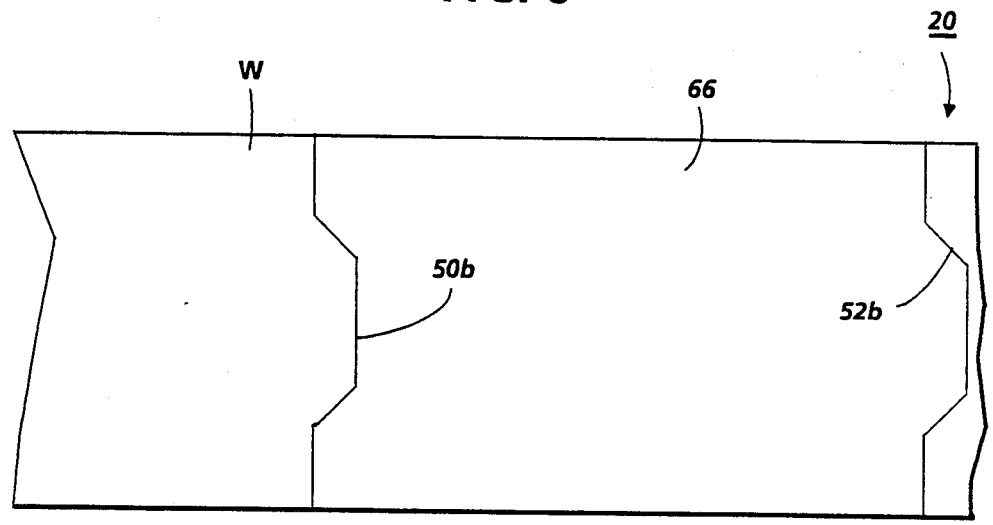

A second method can be used to form the chips described with reference to FIGS. 3-5. As a first example, trench 34, as shown in these figures, is formed with planar butting edges 50, 52. Alternately, and as shown in FIGS. 6 and 7, the edges can be formed with an irregular, wedgeshaped contour. The contoured edges are formed by using an appropriate photomask to expose the resist. Each edge 50a, 52a and 50b, 52b is separately matched with the associated butting edge so that the two butted edges will fit together in tongue and groove fashion. This modification allows precise alignment in both x and y directions and assures side-to-side as well as end-to-end alignment.

According to a another modification, it may be desirable for certain applications to use a p+ silicon substrate rather than the p— substrate 14 shown in FIG. 5. For example, p—/p+ wafers are useful starting material for advanced CMOS chips, including high density memory. In order to replace the p— layer 14 of FIG. 5 with a p+ layer the resistivity of the p+ layer must be high enough so that it is etched in the ODE etchant at the same rate as the p— wafer. In practice, a resistivity of 0.01 ohm cm is appropriate.

Figure 8:
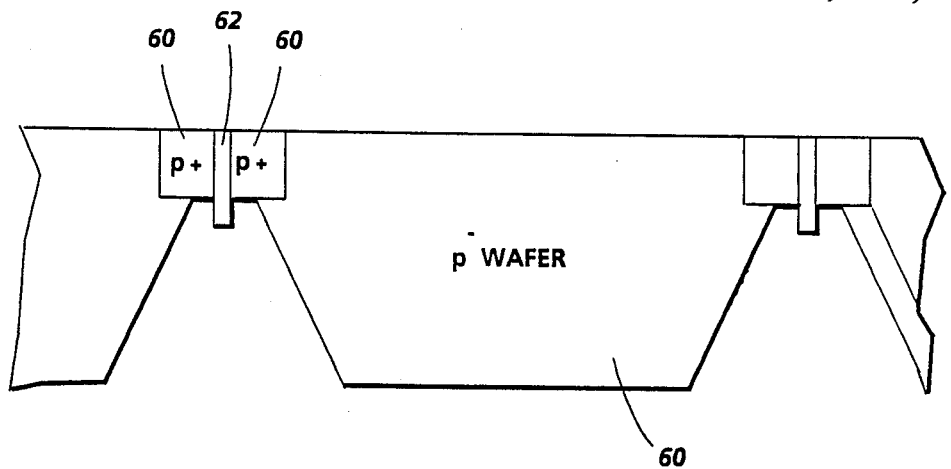
FIG. 8 is an enlarged side view in cross section of a portion of the wafer shown in FIG. 2 showing details of a second chip processing and separation technique.

According to a third modification, for certain applications where the active circuits can be offset towards the center of the wafer (e.g. for thermal ink jet resistors or ionographic printheads) it may be possible to dispense with the p— layer 32 (FIG. 3) and restrict the p+ layer 30 to areas immediately adjacent the trench butt edge surfaces. As shown in FIG. 8, p+ layer 60 is formed by diffusion through a mask which exposes only the areas adjacent the edges of trenches 62. Thus, and referring to FIG. 3 for comparison, p— layer 32 is not required and the p+ layer 60 is restricted to the areas shown adjacent the trench edges.

Figure 9:
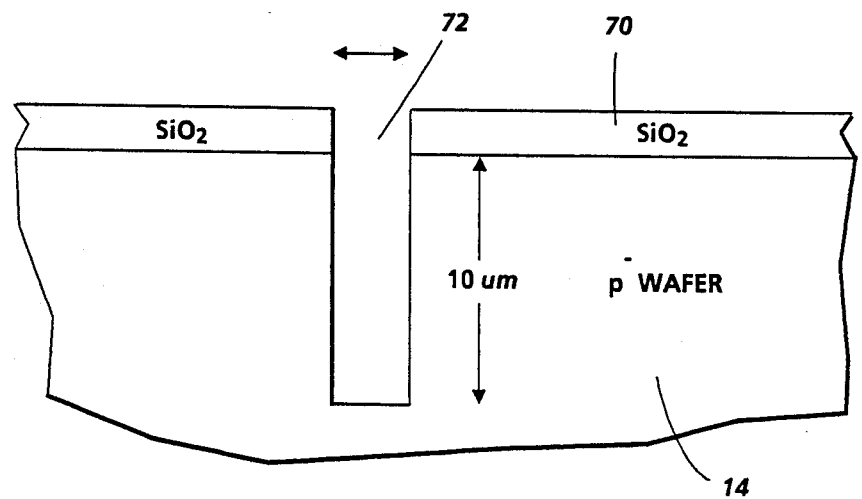
FIGS. 9–11 show an enlarged cross sectional view of a portion of the wafers of FIG. 2 showing a third chip processing and separation technique.
Figure 10:
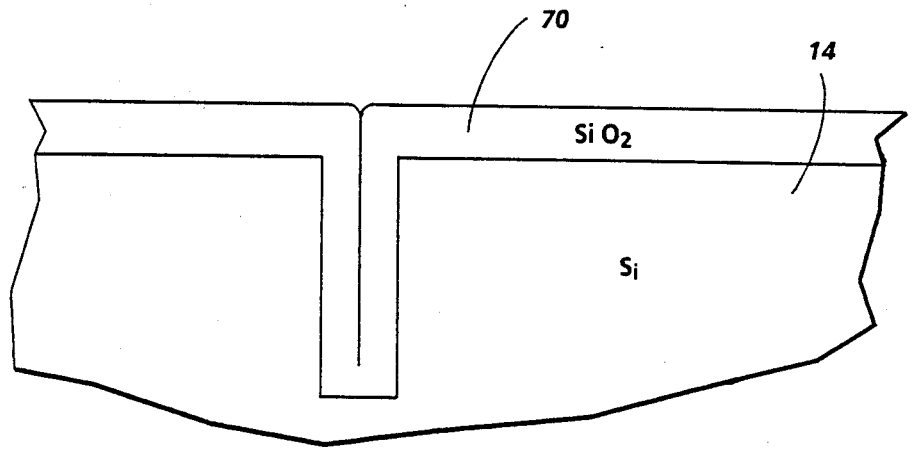
Figure 11:
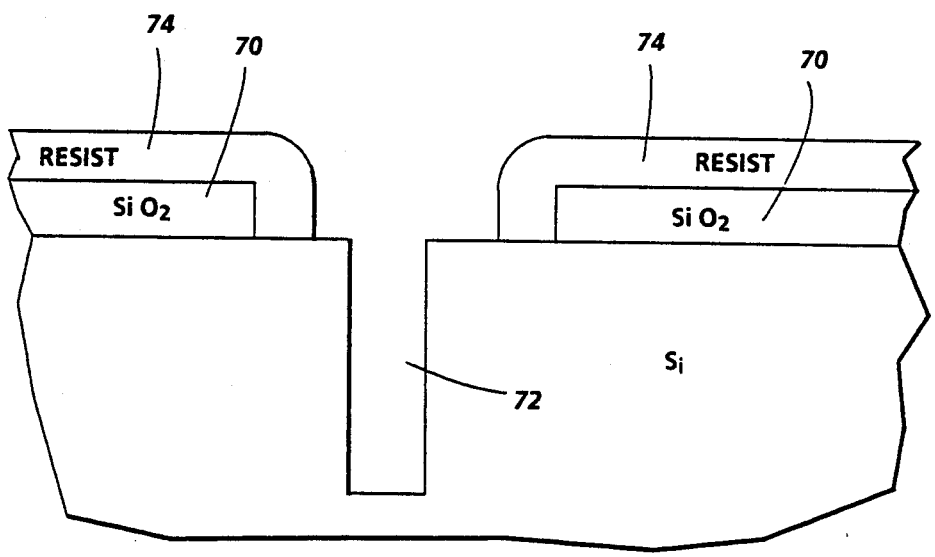

According to another aspect of the invention, and referring to FIGS. 9-11, prior to processing of wafer 14, a 2 micron $S_iO_2$ mask 70 is deposited on the top surface of the wafer. A trench 72, (FIG. 2) 3 microns wide and 10 microns deep, generally following lines 16 and 18, is formed (etched) by a reactive ion etching process. The $S_iO_2$ mask 70 is then stripped and wafer 14 is reoxidized. If trench 72 has been made with 3 micron or less width, a 2 micron thermal oxidation will close over the top of the trench allowing subsequent processing on the wafer surface without the interference of an etch trench (FIG. 10). At the end of the wafer process, a via etch removes the $S_iO_2$ near the trench; a resist layer 74 is reapplied and imaged and a final $S_iO_2$ etch removes the $S_iO_2$ from the trench (FIG. 11). The purpose of the via etch is to provide a bare silicon substrate for the resist to protect the integrated chip circuitry and avoid severe undercutting of the chip passivating $S_iO_2$ during the trench $S_iO_2$ etch.

Figure 12:
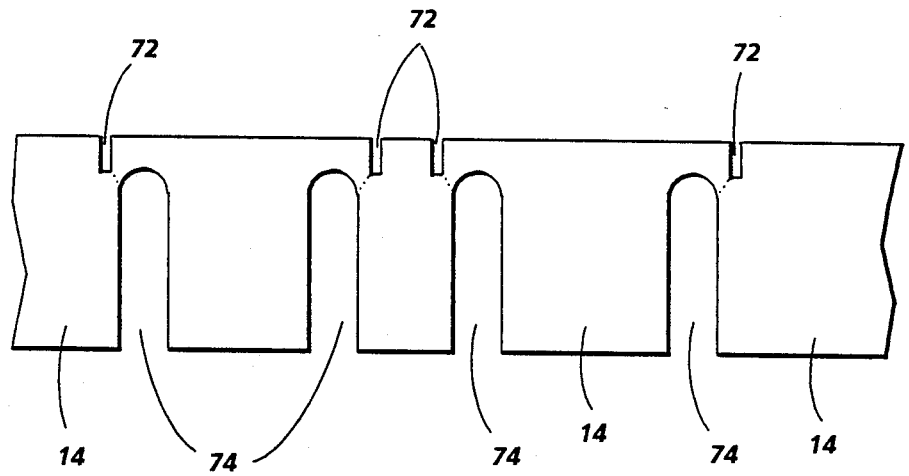
FIG. 12 shows a side view of the wafer following the processing and separation steps shown in FIGS. 9–11.
Figure 13:
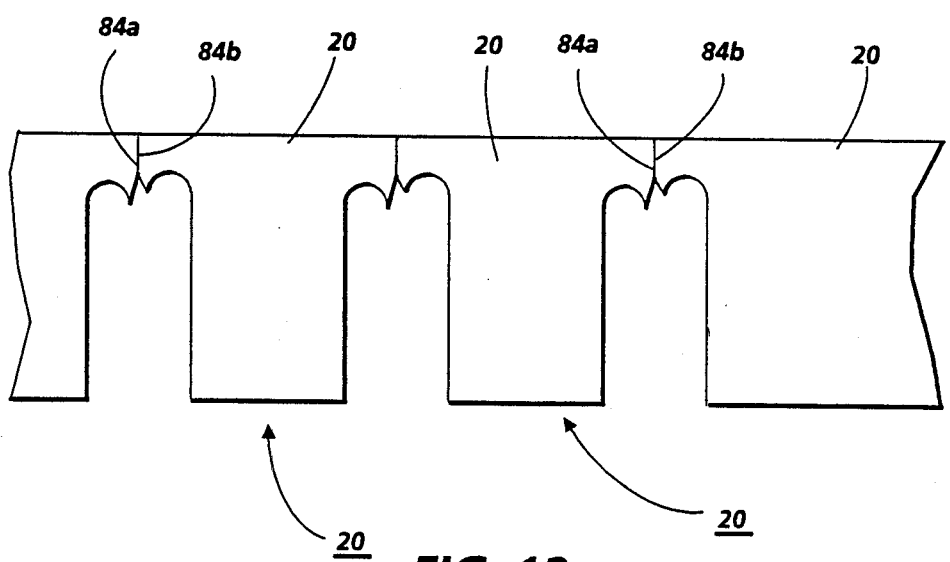
FIG. 13 shows separated chips from FIG. 12 butted together.

Referring now to FIG. 12, a side view of the processing wafer shows the vertical trenches 72. Grooves 74, having centerlines offset from the centerlines of the trenches, are formed by known dicing techniques. Wafer 14 is then subjected to a fracturing force at each of the trenches 72 causing separation as indicated by the dotted lines. The separated chips 20, assuming they tested satisfactorily, are butted together as shown in FIG. 13. Butting surfaces 84a, 84b have flat vertical edges instead of the sharp edges characterized in the prior art. Thus variations in two butting chips 20 do not result in any lateral displacement.

Figure 14:
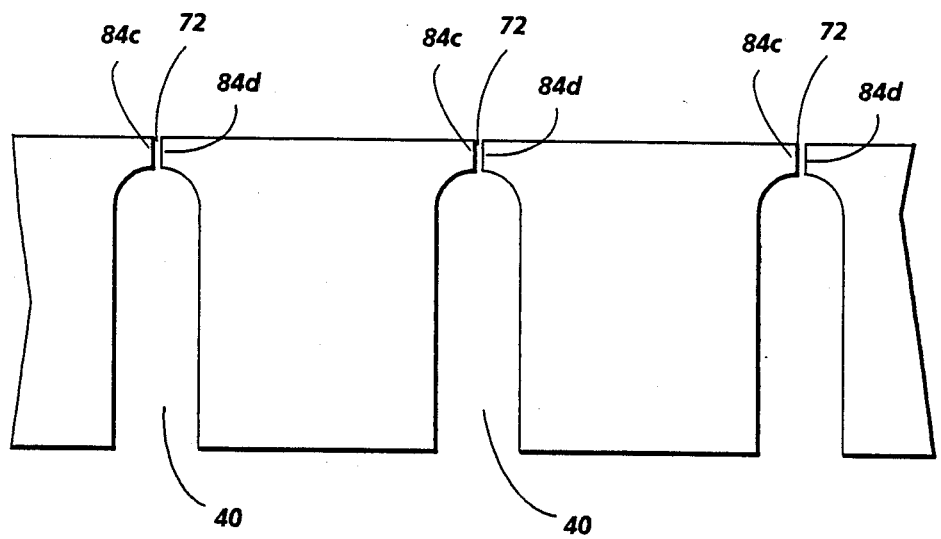
FIG. 14 shows another embodiment wherein chips from the wafer of FIG. 2 are formed by a dice cut meeting a reactive ion trench.
Figure 15:
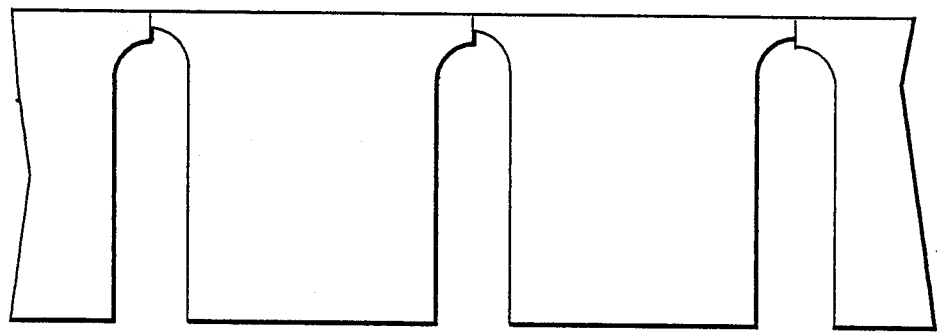
FIG. 15 shows the butting together of chips formed by the process of FIG. 14.

A still further embodiment is shown in FIGS. 14 and 15. In FIG. 14, the grooves 40 are formed to intersect trenches 72. With this method, precise butting surfaces 84c, 84d, are produced without the possible damage attendant with the fracture technique of the FIG. 12 and 13 embodiment.

Figure 16:
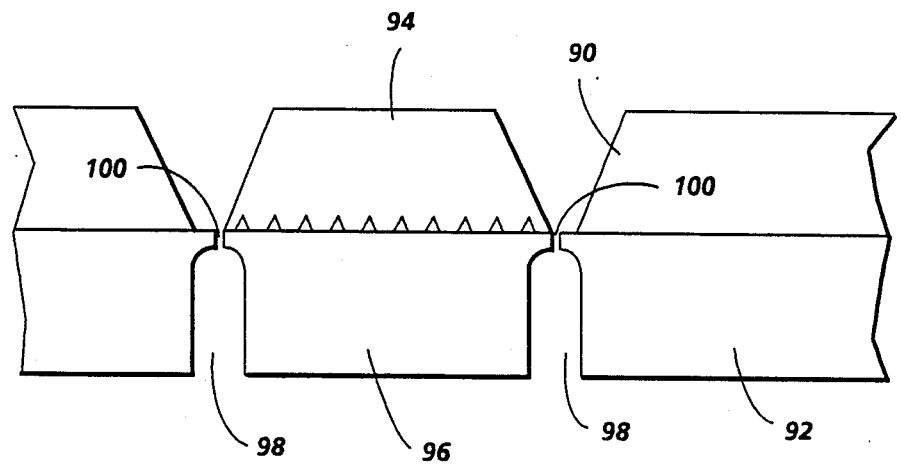
FIGS. 16 and 17 show a side view of a dual wafer, ink jet print head formed by the etching and processing technique of the present invention.
Figure 17:
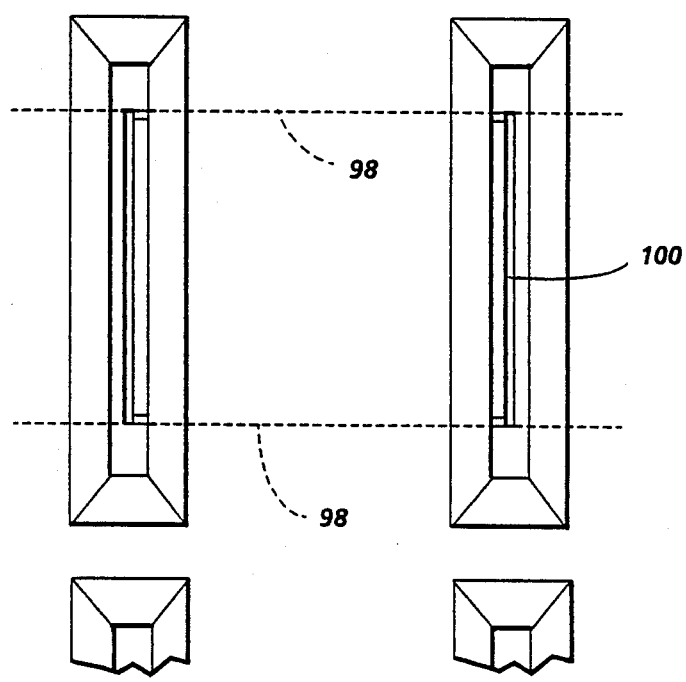

The chip processing and separation methods described above are generic to any application requiring the precise, damage-free butting of single die pieces. In the specific application of a thermal jet printer, a two wafer sandwich is required to be separated into individual buttable chips. This can be accomplished by the previous methods described provided that the top wafer (the channel plate) is designed so as to not prevent the separation of the sandwich after the trench-die cut frees the bottom (resistor) wafer. FIGS. 16, 17 show how this is accomplished. FIG. 16 shows an enlarged partial cross section having an upper wafer 90 and a lower wafer 92. Upper wafer 90 has formed thereon a plurality of channel plates 94 while sandwich 92 has integrally formed therein a plurality of resistor heater plates 96. The channel plates 94 are fabricated so that, in the separation areas, the channel plates are not connected to each other, the connections being at the front and back of the channel die, in areas that can be easily cut away by dicing saw after the heater and channel plates are firmly adhesively bonded. When this is done, it only remains to form dice cuts 98 (FIG. 17) along the back of the heater wafer down to the reactive ion etching trenches 100 to free the sandwich die from the wafer.

Once the chips have been separated by any of the techniques described above, they may be precisely butted together, or aligned by any of several known techniques. For example, the chips 20 may be aligned by means of a robot vacuum, operating under a closed loop optical pattern recognition system.

While the invention has been described with reference to the structure disclosed, it is not confined to the specific details set forth, but is intended to cover such modifications or changes as may come within the scope of the following claims.

What is claimed is:

1. A method for separating integrated circuit chips formed on a crystalline substrate comprising the steps of
   (a) forming a plurality of vertical trenches along predetermined intersecting lateral boundaries on the top surface of said substrate by a reactive ion etch process,
   (b) filling in said trenches with an etchable material,
   (c) forming a plurality of integrated circuits on the surface of said substrate with said lateral boundaries,
   (d) passivating both surfaces of said substrate,
   (e) and etching a plurality of grooves on the back of the wafer in general alignment with said vertical trenches, said etching being adapted to etch into, and free said trenches from said etchable material, whereby said integrated circuits are separated by the combined action of said top and bottom etching steps, said circuits being formed with planar butting surfaces created by the vertical trench formation.

2. The method of claim 1 wherein said substrate is a silicon wafer.

3. The method of claim 2 including the further steps of forming a p+ layer adjoining said trenches, said p+ layer serving as a stop to the groove etch.

4. The method of claim 2 including formation of a buried n-layer and using a reverse biased junction as a stop for the ODE groove etch.

5. The method of claim 3 wherein said p+ layer is formed by diffusion into the top surface of the substrate on both sides of the trenches, extending a vertical distance substantially equal to the trench sides.

6. The method of claim 3 wherein said p+ layer is formed below the surface of said wafer and near the bottom of said trench and including the further step of forming a lightly doped p− layer above said p+ layer.

7. The method of claim 3 wherein said trench is formed with a width of 3 microns and depth of approximately 10 microns.

8. The method of claim 2 including the further step of the step of oxidizing the trench and filling said trench with polysilicon.

9. The method of claim 8 wherein said orientation etch is interrupted by a wet oxide etching step to etch through the oxide layer formed at the bottom of the trench.

10. The method of claim 2 wherein said substrate is p+ silicon.

11. The method of claim 2 wherein said substrate is p− silicon having a resistivity of approximately 0.01 ohm/cm.

12. The method of claim 1 wherein said bottom grooves are formed by a dicing procedure that forms a groove whose centerline is offset from the centerline of said trenches and including an additional step of repeating the chips by fracturing along the trench groove interface.

13. The method of claim 2 wherein said integrated circuits form a resistor plate for an ink jet printhead and including the further step of bonding a second silicon wafer to the top of said resistive plate to form a channel plate for a ink jet printhead.

* * * * *